(12) United States Patent
Bae (10) Patent No.: US 11,704,051 B2
(45) Date of Patent: Jul. 18, 2023

(54) DATA STORAGE APPARATUS AND INTERFACE CIRCUIT THEREFOR

(71) Applicant: SK hynix Inc., Icheon-si (KR)

(72) Inventor: Sang Geun Bae, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 42 days.

(21) Appl. No.: 17/393,001

(22) Filed: Aug. 3, 2021

(65) Prior Publication Data

US 2022/0291863 A1   Sep. 15, 2022

(30) Foreign Application Priority Data

Mar. 12, 2021   (KR) .......................... 10-2021-0032790

(51) Int. Cl.
*G06F 3/06* (2006.01)
*G06F 1/06* (2006.01)
*G11C 7/10* (2006.01)

(52) U.S. Cl.
CPC .............. *G06F 3/0655* (2013.01); *G06F 1/06* (2013.01); *G06F 3/061* (2013.01); *G06F 3/0679* (2013.01); *G11C 7/1066* (2013.01)

(58) Field of Classification Search
CPC .......... G06F 3/0655; G06F 1/06; G06F 3/061; G06F 3/0679; G06F 3/0658; G06F 1/04; G11C 7/1066; G11C 7/1093; G11C 7/1084; G11C 7/1051; G11C 7/222; G11C 7/1078; G11C 7/12; G11C 8/08; H03K 5/1565; H03L 7/0814
USPC ........................................................ 365/194
See application file for complete search history.

(56) References Cited

U.S. PATENT DOCUMENTS

| | | | |
|---|---|---|---|
| 10,482,060 B2 * | 11/2019 | Teh ....................... | G06F 13/4291 |
| 2015/0341019 A1 * | 11/2015 | Jung ....................... | H03K 17/16 |
| | | | 327/108 |

FOREIGN PATENT DOCUMENTS

| | | |
|---|---|---|
| KR | 100862233 B1 | 10/2008 |
| KR | 101045071 B1 | 6/2011 |
| KR | 20150134002 A | 12/2015 |
| KR | 20190051314 A | 5/2019 |

* cited by examiner

*Primary Examiner* — Fernando Hidalgo
(74) *Attorney, Agent, or Firm* — Perkins Coie LLP (57) ABSTRACT

A data storage apparatus is provided to include a memory device including memory cells for storing data; and an interface circuit coupled as an interface between the host device and the memory device and configured to transmit a transmission signal to the host. The interface circuit includes a delay circuit configured to generate a delay code and is configured to generate an additional signal to be combined with the transmission signal based on the delay code.

18 Claims, 9 Drawing Sheets

DATA STORAGE APPARATUS AND INTERFACE CIRCUIT THEREFOR

CROSS-REFERENCES TO RELATED APPLICATION

This patent document claims the priority and benefits of Korean application number 10-2021-0032790, filed on Mar. 12, 2021, which is incorporated herein by reference in its entirety.

TECHNICAL FIELD

The technology and implementations disclosed in this patent document generally relate to a semiconductor integrated apparatus, and more particularly, to a data storage apparatus and an interface circuit therefor.

BACKGROUND

A data storage apparatus may include a memory device in which data is stored and a controller that transmits and receives data to and from the memory device in response to a request from a host. The memory device and the controller transmit and receive data through an interface circuit and a channel.

Many studies have been done in order to ensure the integrity of data transmitted and received between the memory device and the controller.

SUMMARY

In one aspect, a data storage apparatus is provided to include: a host including a memory controller; and a memory device configured to communicate with the host through an interface circuit, wherein the interface circuit is configured to generate an additional signal to be combined with a transmission signal, which is to be transmitted to the host, on the basis of a delay code generated by a delay-locked loop circuit.

In another aspect, a data storage apparatus for storing data under control by a memory controller of a separate host device is provided. The data storage apparatus may include: a memory device including memory cells for storing data; and an interface circuit coupled as an interface between the host device and the memory device and configured to transmit a transmission signal to the host. The interface circuit includes a delay circuit configured to generate a delay code and is configured to generate an additional signal to be combined with the transmission signal based on the delay code.

In another aspect, a data storage apparatus is provided to include: an interface circuit including an input/output control circuit; and a memory device configured to transmit and receive data to and from a host through the interface circuit. The input/output control circuit comprises: a delay circuit configured to generate an internal clock signal and a delay code based on a clock signal transmitted from the host; and a plurality of input/output circuits each configured to receive the delay code and generate an additional signal to be combined with a transmission signal to be transmitted to the host.

In another aspect, an interface circuit is provided in a storage device including a memory device. The interface circuit comprising: a delay circuit configured to generate an internal clock signal and a delay code based on a clock signal transmitted from a host; and a plurality of input/ output circuits, each configured to receive the delay code and generate an additional signal to be combined with a transmission signal to be transmitted to the host.

DETAILED DESCRIPTION

Hereinafter, embodiments of the present disclosure will be described in more detail with reference to the accompanying drawings.

With an increase in the capacity and speed of the data storage apparatus, the number of unit input/output circuits provided in the interface circuit increase. Accordingly, there have been more studies to accurately and efficiently generate a signal to be provided to each input/output circuit.

Figure 1:
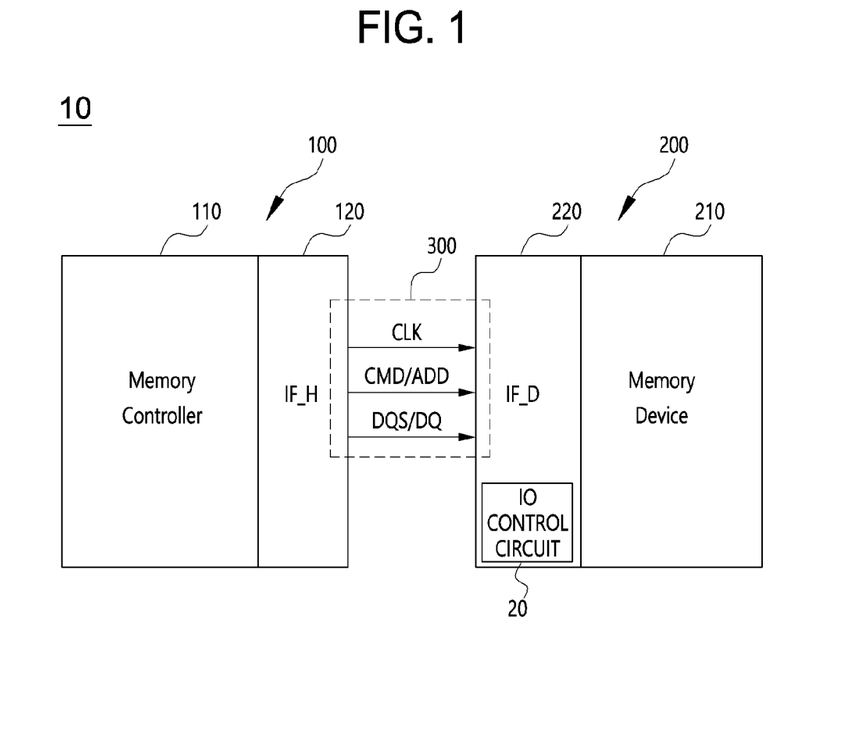
FIG. 1 is a configuration diagram of a data storage apparatus in accordance with an embodiment of the disclosed technology.

FIG. 1 is a configuration diagram of a data storage apparatus 10 in accordance with an embodiment.

The data storage apparatus 10 may include a host 100 and a storage device 200 connected to or in communication with the host 100 through a channel 300.

The host 100 may include a memory controller 110 for controlling the storage device 200 and a first interface circuit 120 which is a host-side interface circuit IF_H. The storage device 200 may include a memory device 210 and a second interface circuit 220 which is a memory-side interface circuit IF_D.

The host 100 may include a processor and a plurality of IPs (Intellectual Property cores) that operate under the control of the processor. The host 100 may be a system on chip (SoC) in which a plurality of functional blocks operating various functions, for example, IPs are implemented as a single chip. The first interface circuit 120 is also a single IP and may be integrated into the host 100 implemented as an SoC.

The memory device 210 may be implemented using a memory element selected from volatile memory elements such as a dynamic random access memory (DRAM), a static random access memory (SRAM), or a thyristor random access memory (TRAM).

The memory device 210 may be implemented using a memory element. In some implementations, the memory element may be a nonvolatile memory element such as an electrically erasable and programmable ROM (EEPROM), a NAND flash memory, a NOR flash memory, a phase-change RAM (PRAM), a resistive RAM (ReRAM), a ferroelectric RAM (FRAM), or a spin torque transfer magnetic RAM (STT-MRAM). In some implementations, the memory element may be implemented in the form of a solid state drive (SSD), a memory card, a universal flash storage (UFS), or others. The memory device 210 may include a plurality of dies, a plurality of chips, or a plurality of packages. The memory device 210 may operate as a single-level cell that stores one-bit data in one memory cell or a multi-level cell that stores multiple bits of data in one memory cell.

The channel 300 provides a path for signals to be transmitted and received between the host 100 and the storage device 200.

The host 100 may transmit at least one of a clock signal CLK, a command signal CMD, an address signal ADD, or others to the second interface circuit 220 through the first interface circuit 120. Furthermore, the host 100 may transmit data DQ to the storage device 200 through the first interface circuit 120 in synchronization with a data strobe signal DQS.

The storage device 200 may transmit the data DQ to the host 100 through the second interface circuit 220 in synchronization with the data strobe signal DQS.

The path through which the host 100 transmits the data strobe signal DQS and the data DQ to the storage device 200 may be substantially the same as the path through which the storage device 200 transmits the data strobe signal DQS and the data DQ to the host 100 and may be shared. Accordingly, the data strobe signal DQS and the data DQ outputted from the host 100 to the storage device 200 may be referred to as write DQS and write DQ, and the data strobe signal DQS and the data DQ outputted from the storage device 200 to the host 100 may be referred to as read DQS and read DQ.

Since the memory device 210 having a high operation speed of double data rate (DDR) or more uses both a rising edge and a falling edge of an internal clock, it is important to keep the duty cycle of the internal clock at 50%.

To this end, the second interface circuit 220 may perform a duty cycle correction (DCC) training operation for adjusting the duty cycle of an internal clock, which is generated from an external clock signal CLK received from the host 100, to 50% during a power-up operation. In an embodiment, the second interface circuit 220 may perform a page read at the DDR by transmitting a read enable signal RE_t/c to the memory device 210 in synchronization with the external clock signal CLK during the DCC training operation.

The storage device 200 may also include a DLL (delay-locked loop) circuit for generating a delay-locked internal clock by correcting a skew of a clock signal whose duty cycle is corrected by DCC training. The DLL circuit may correct the delay amount of an internal clock signal so as to compensate for a delay component generated in the process of transferring the internal clock signal to a data output terminal inside a semiconductor memory device.

In an embodiment, the second interface circuit 220 may include a plurality of input/output (JO) control circuits 20.

The DLL circuit may be implemented as a digital circuit that generates a delay-locked internal clock signal according to a delay code generated in response to a read enable signal RE_t used in DCC training and may be integrated into the JO control circuit 20.

The second interface circuit 220 may perform a pre-emphasis operation in order to substantially prevent signal attenuation or an effect of noise that may occur in the process of transmitting data read from the memory device 210 to the host 100 via the channel 300. The pre-emphasis technique has been proposed to ensure the integrity data, which substantially prevents distortion of a signal passing through the channel 300 by adding an additional signal to a section in which the logical level of data to be transmitted is transitioned. The additional signal for pre-emphasis may be generated by delaying data to be transmitted by a predetermined time. Some aspect of the disclosed technology allows to accurately control the delay time and provide the additional signal more accurately and efficiently.

In an embodiment, the second interface circuit 220 may perform a DCC training operation and a pre-emphasis operation. Thus, the second interface circuit 220 may generate an additional signal for pre-emphasis by delaying a transmission signal by a target time (1 unit delay) based on a delay code generated by operating the DLL circuit in the IO control circuit 20. The additional signal is to be combined with the transmission signal.

As the capacity of the memory device 210 increases, the IO control circuit 20 may include a plurality of IO circuits. When a transmission signal is delayed from the outside of the IO control circuit 20 for pre-emphasis and is supplied to the IO control circuit 20, a separate delay circuit needs to be added, so an additional area for the delay circuit is required and additional work such as change in the arrangement of the IP may be involved.

In accordance with some implementations of the disclosed technology, a delay code may be generated in the IO control circuit 20 and transmission data may be pre-emphasized using the delay code. Accordingly, there is no need to add a separate circuit or IP for delaying a transmission signal, thereby increasing area efficiency and ensuring the reliability of a high-speed operation.

Figure 2:
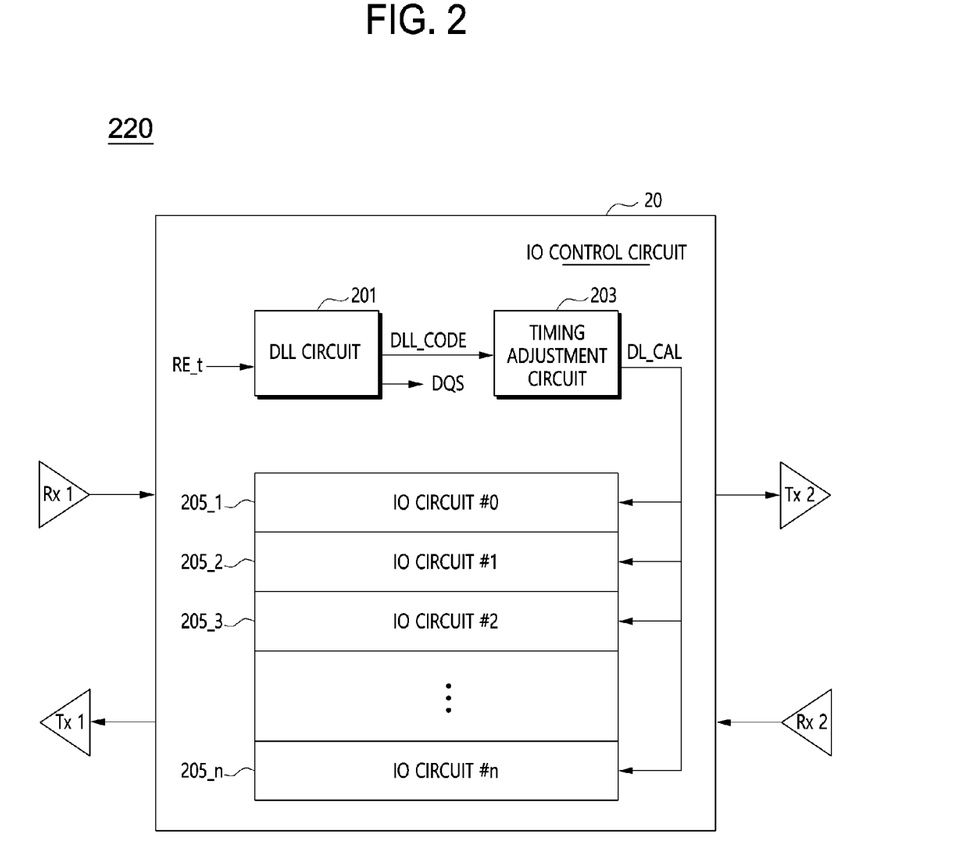
FIG. 2 is a configuration diagram of an interface circuit in accordance with an embodiment of the disclosed technology.

FIG. 2 is a configuration diagram of an interface circuit in accordance with an embodiment of the disclosed technology. For example, the interface circuit as shown in FIG. 2 corresponds to the second interface circuit 220.

Referring to FIG. 2, the second interface circuit 220 in accordance with an embodiment may include the IO control circuit 20 that transmits and receives signals between transmission drivers Tx1 and Tx2 and reception drivers Rx1 and Rx2.

The JO control circuit 20 may include a DLL circuit 201, a timing adjustment circuit 203, and a plurality of JO circuits 205 (205-1 to 205-n).

The DLL circuit 201 may receive the read enable signal RE_t used in the DCC training operation to generate a delay code DLL_CODE for locking the delay amount of an internal clock, and output a delay-locked internal clock signal DQS.

When the internal clock signal DQS is transmitted to the host 100 and data DQ is transmitted in synchronization with the internal clock signal DQS during a read operation, the operation timing of the host 100 and the storage device 200 may be synchronized.

The timing adjustment circuit 203 may receive the delay code DLL_CODE and generate a delay control signal DL_CAL. In order to perform a pre-emphasis operation of emphasizing a transmission signal at the time of transmitting the transmission signal, the transmission signal is delayed by 1 unit interval (UI) to generate an additional signal. Thus, the timing adjustment circuit 203 may generate a delay control signal DL_CAL corresponding to 1 UI by halving a delay code DLL_CODE corresponding to one cycle 2 UI of a clock.

Each of the plurality of JO circuits 205-1 to 205-n is configured to receive the delay control signal DL_CAL, generate an additional signal by delaying a transmission signal, combine the additional signal with the transmission signal, and transmit the combined signal to the host 100. The IO circuits 205-1 to 205-n will be described below in detail with reference to FIG. 4 and FIG. 5.

Figure 3:
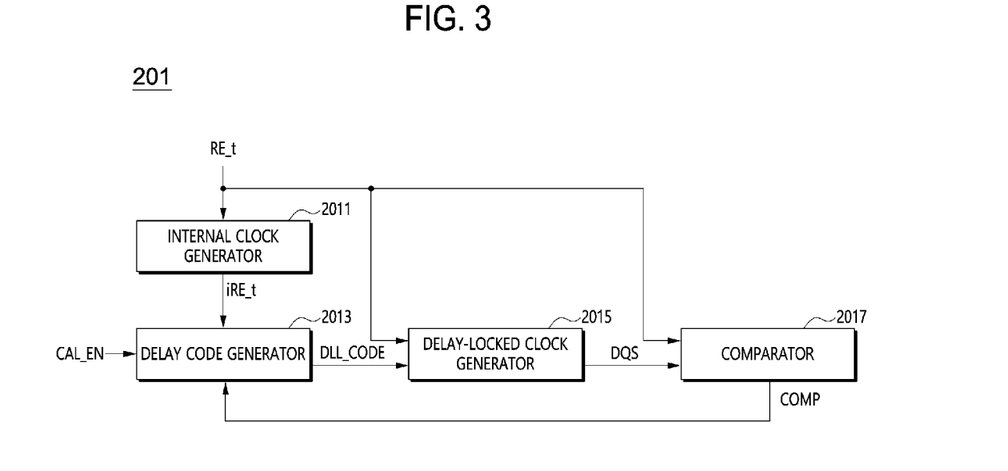
FIG. 3 is a configuration diagram of a delay-locked loop circuit in accordance with an embodiment of the disclosed technology.

FIG. 3 is a configuration diagram of the DLL circuit 201 in accordance with an embodiment of the disclosed technology.

Referring to FIG. 3, the DLL circuit 201 in accordance with an embodiment may include an internal clock generator 2011, a delay code generator 2013, a delay-locked clock generator 2015, and a comparator 2017.

The internal clock generator 2011 may generate a preliminary clock signal iRE_t from a clock signal used in DCC training, for example, the read enable signal RE_t.

The delay code generator 2013 may output a delay code DLL_CODE corresponding to a delay amount for delaying the preliminary clock signal iRE_t in response to an enable signal CAL_EN and a comparison signal COMP.

In an embodiment, the delay code DLL_CODE may be a multi-bit digital code indicating a time corresponding to one cycle of an internal clock signal DQS to be finally generated.

The delay-locked clock generator 2015 may generate the internal clock signal DQS by delaying the read enable signal RE_t by a time corresponding to the delay code DLL_CODE. For example, the delay code DLL_CODE may delay the read enable signal RE_t by a time corresponding to one cycle of the internal clock signal DQS.

The comparator 2017 may be configured to transmit the comparison signal COMP, which is obtained by comparing the phases of the internal clock signal DQS and the read enable signal RE_t, to the delay code generator 2013 so that the delay code DLL_CODE is updated.

The DLL circuit 201 illustrated in FIG. 3 may be implemented as a digital circuit and may be integrated into the aforementioned IO control circuit 20.

Figure 4:
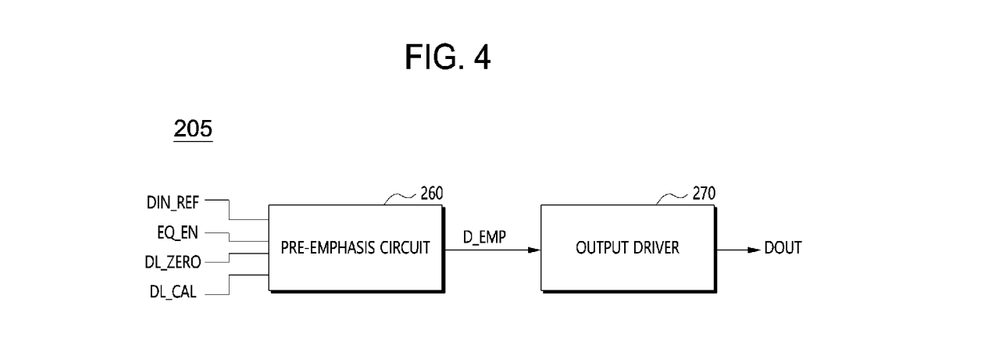
FIG. 4 is a configuration diagram of an input/output circuit in accordance with an embodiment of the disclosed technology.

FIG. 4 is a configuration diagram of the IO circuit 205 in accordance with an embodiment of the disclosed technology.

Referring to FIG. 4, the IO circuit 205 in accordance with an embodiment may include a pre-emphasis circuit 260 and an output driver 270.

The pre-emphasis circuit 260 may receive transmission data DIN_REF, an enable signal EQ_EN, a first delay control signal DL_ZERO, and a second delay control signal DL_CAL. When the enable signal EQ_EN is in an inactive state, the pre-emphasis circuit 260 may generate an emphasis signal D_EMP by combining non-delayed transmission data DIN_REF with the transmission data DIN_REF in response to the first delay control signal DL_ZERO. When the enable signal EQ_EN is in an active state, the pre-emphasis circuit 260 may generate an additional signal by delaying the transmission data DIN_REF by a delay amount 1 UI corresponding to the delay control signal DL_CAL in response to the second delay control signal DL_CAL, and generate the emphasis signal D_EMP by combining the additional signal with the transmission data DIN_REF.

The output driver 270 may drive the emphasis signal D_EMP to apply a data signal to an output pad DOUT, and transmit the emphasis signal D_EMP to the host 100.

Although not illustrated in the drawing, the output driver 270 may include a plurality of unit drivers (legs) that are turned on/off according to an impedance matching code.

In an embodiment, the pre-emphasis circuit 260 may be integrated with the output driver 270. In such a case, when a driver in an off state is used as a pre-emphasis circuit among the plurality of unit drivers constituting the output driver 270, there is no need to add a separate circuit for the pre-emphasis operation, so that it is possible to reduce the size of the second interface circuit 220.

Figure 5:
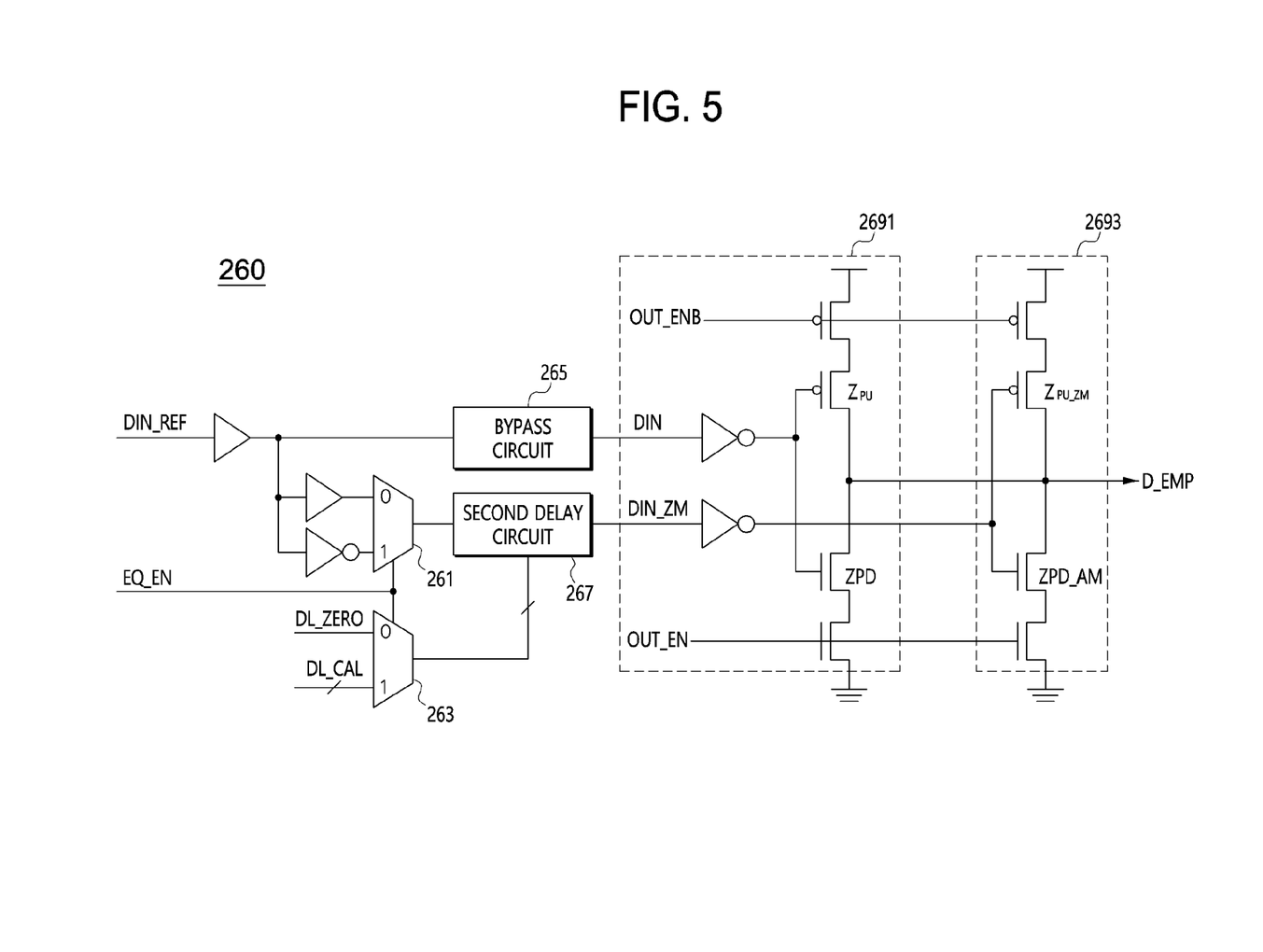
FIG. 5 is a configuration diagram of a pre-emphasis circuit in accordance with an embodiment of the disclosed technology.

FIG. 5 is a configuration diagram of the pre-emphasis circuit 260 in accordance with an embodiment of the disclosed technology.

Referring to FIG. 5, the pre-emphasis circuit 260 in accordance with an embodiment may include a first selection circuit 261, a second selection circuit 263, a bypass circuit 265, a second delay circuit 267, a first driving circuit 2691, and a second driving circuit 2693.

The bypass circuit 265 is a non-delay circuit and may be configured to receive the transmission data DIN_REF and output the transmission data DIN_REF as source data DIN by bypassing, i.e., without any delay the transmission data DIN_REF.

The first selection circuit 261 may be configured to select any one of the transmission data DIN_REF and an inverted signal thereof in response to the enable signal EQ_EN, and provide the selected one to the second delay circuit 267. In an embodiment, the first selection circuit 261 may be configured to select the transmission data DIN_REF when the enable signal EQ_EN is in an inactive state, and to select inverted transmission data DIN_REF when the enable signal EQ_EN is in an active state.

The second selection circuit 263 may select any one of the first delay control signal DL_ZERO and the second delay control signal DL_CAL in response to the enable signal EQ_EN, and provide the selected one to the second delay circuit 267. In an embodiment, the second selection circuit 263 may be configured to select the first delay control signal DL_ZERO with a delay amount of 0 when the enable signal EQ_EN is in an inactive state, and to select the second delay control signal DL_CAL with a delay amount of 1 UI when the enable signal EQ_EN is in an active state.

The second delay circuit 267 may generate an additional signal DIN_ZM by delaying the signal provided from the first selection circuit 261, that is, the transmission data DIN_REF or the inverted signal thereof, on the basis of the first delay control signal DL_ZERO or the second delay control signal DL_CAL provided from the second selection circuit 263.

The first driving circuit 2691 may amplify and output the source data DIN provided from the bypass circuit 265. The second driving circuit 2693 may drive the additional signal DIN_ZM, combine the additional signal DIN_ZM with a source signal DIN, and output the emphasis signal D_EMP.

As the second delay control signal DL_CAL is generated from the DLL circuit 201 provided in the IO control circuit 20 and is provided to the respective IO circuits 205, it is possible to generate an additional signal that does not depend on PVT variations even without adding a separate delay circuit.

Accordingly, it is possible to ensure data integrity without wasting an area for a delay circuit.

Figure 6A:
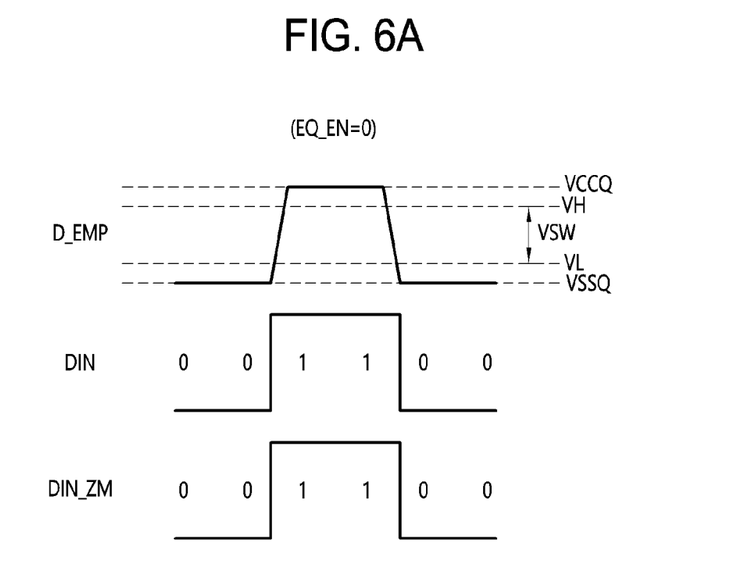
FIG. 6A and FIG. 6B are waveform diagrams of a transmission signal according to whether pre-emphasis is performed of the disclosed technology.
Figure 6B:
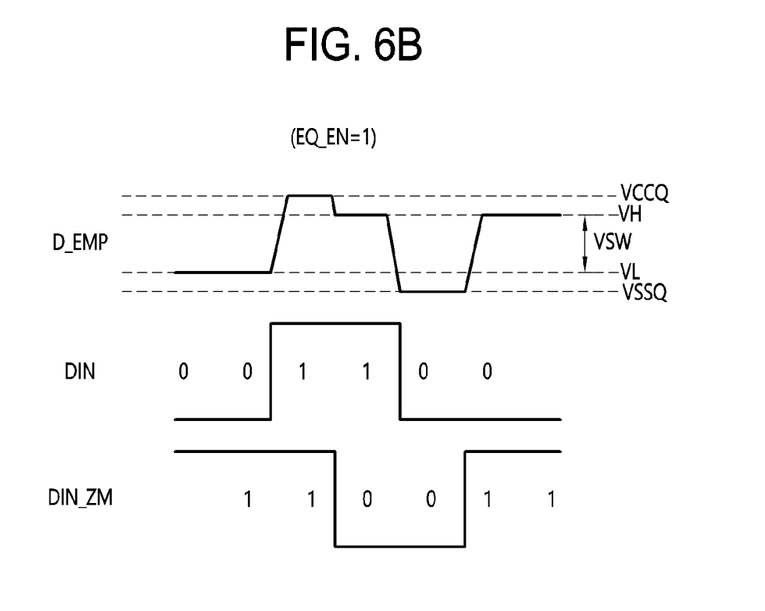

FIG. 6A and FIG. 6B are waveform diagrams of a transmission signal according to whether pre-emphasis is performed.

FIG. 6A is a waveform diagram of a transmission signal when no pre-emphasis is performed, that is, when the enable signal EQ_EN is in an inactive state.

Since the enable signal EQ_EN is in an inactive state, the first selection circuit 261 outputs non-inverted transmission data DIN_REF and the second selection circuit 263 selects and outputs the first delay control signal DL_ZERO. Since the first delay control signal DL_ZERO is a signal with a delay amount of 0, an additional signal DIN_ZM with substantially the same phase and logic level as those of the source data DIN outputted from the bypass circuit 265 is outputted from the second delay circuit 267.

The source data DIN is driven by the first driving circuit 2691 and the additional signal DIN_ZM is driven by the second driving circuit 2693, so that an emphasis signal D_EMP, in which the high level $V_H$ and the low level $V_L$ of the source signal DIN are enhanced to VCCQ and VSSQ, respectively, may be outputted.

FIG. 6B is a waveform diagram of transmission data when pre-emphasis is performed, that is, when the enable signal EQ_EN is in an active state.

Since the enable signal EQ_EN is in an active state, the first selection circuit 261 outputs inverted transmission data DIN_REF and the second selection circuit 263 selects and outputs the second delay control signal DL_CAL. Since the second delay control signal DL_CAL is a signal with a delay amount of 1 UI, the second delay circuit 267 delays the inverted transmission data DIN_REF by 1 UI and outputs an additional signal DIN_ZM delayed by 1 UI from the source data DIN.

The source data DIN is driven by the first driving circuit 2691 and the additional signal DIN_ZM is driven by the second driving circuit 2693, so that an emphasis signal D_EMP enhanced to VCCQ and VSSQ may be outputted in a section where the high level $V_H$ of the source signal DIN and the high level $V_H$ of the additional signal DIN_ZM overlap and a section where the low level $V_L$ of the source signal DIN and the low level $V_L$ of the additional signal DIN_ZM overlap, that is, at a time point where the logic level of the source signal DIN is transitioned.

By emphasizing a transmission signal by an additional signal in a high-frequency section where a bit value of the source data DIN is toggled, it is possible to substantially prevent the transmission signal transmitted via a channel from being attenuated.

Figure 7:
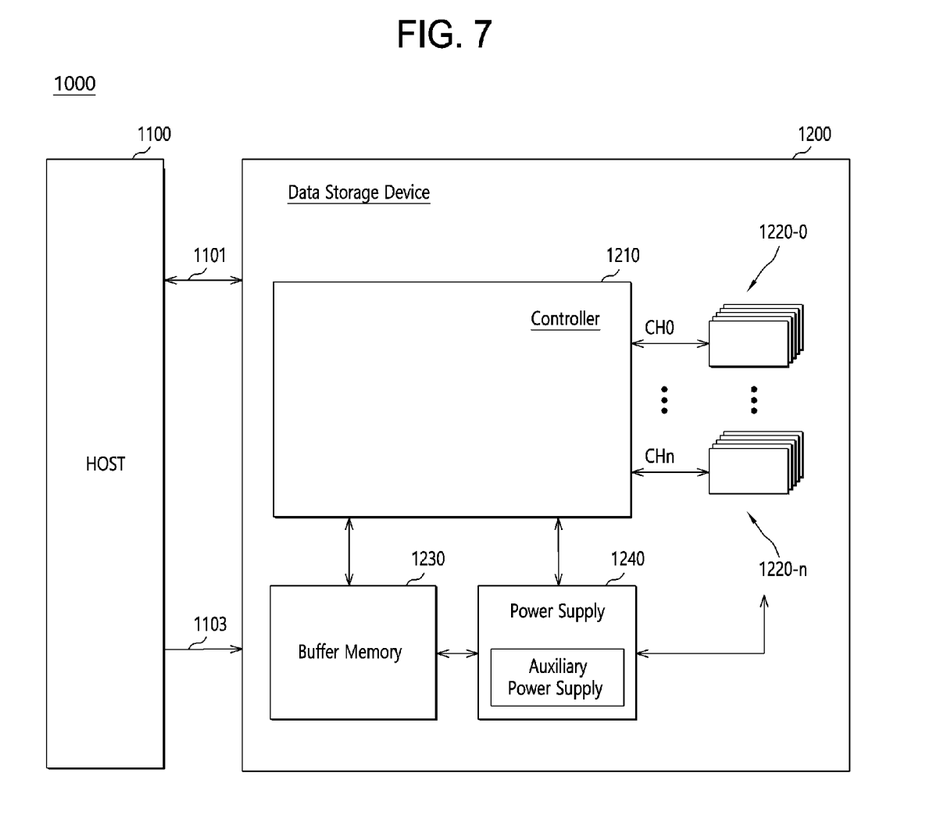
FIG. 7 is a diagram illustrating a data storage system in accordance with an embodiment of the disclosed technology.

FIG. 7 is a diagram illustrating a data storage system 1000, in accordance with an embodiment.

Referring to FIG. 7, the data storage 1000 may include a host device 1100 and the data storage device 1200. In an embodiment, the data storage device 1200 may be configured as a solid state drive (SSD).

The data storage device 1200 may include a controller 1210, a plurality of nonvolatile memory devices 1220-0 to 1220-n, a buffer memory device 1230, a power supply 1240, a signal connector 1101, and a power connector 1103.

The controller 1210 may control general operations of the data storage device 1200. The controller 1210 may include a host interface unit, a control unit, a random access memory used as a working memory, an error correction code (ECC) unit, and a memory interface unit. In an embodiment, the controller 1210 may configured as controller 110 shown in FIGS. 1 and 2.

The host device 1100 may exchange a signal with the data storage device 1200 through the signal connector 1101. The signal may include a command, an address, data, and so forth.

The controller 1210 may analyze and process the signal received from the host device 1100. The controller 1210 may control operations of internal function blocks according to firmware or software for driving the data storage device 1200.

The buffer memory device 1230 may temporarily store data to be stored in at least one of the nonvolatile memory devices 1220-0 to 1220-n. Further, the buffer memory device 1230 may temporarily store the data read from at least one of the nonvolatile memory devices 1220-0 to 1220-n. The data temporarily stored in the buffer memory device 1230 may be transmitted to the host device 1100 or at least one of the nonvolatile memory devices 1220-0 to 1220-n according to control of the controller 1210.

The nonvolatile memory devices 1220-0 to 1220-n may be used as storage media of the data storage device 1200. The nonvolatile memory devices 1220-0 to 1220-n may be coupled with the controller 1210 through a plurality of channels CH0 to CHn, respectively. One or more nonvolatile memory devices may be coupled to one channel. The nonvolatile memory devices coupled to each channel may be coupled to the same signal bus and data bus.

The power supply 1240 may provide power inputted through the power connector 1103 to the controller 1210, the nonvolatile memory devices 1220-0 to 1220-n and the buffer memory device 1230 of the data storage device 1200. The power supply 1240 may include an auxiliary power supply. The auxiliary power supply may supply power to allow the data storage device 1200 to be normally terminated when a sudden power interruption occurs. The auxiliary power supply may include bulk-capacity capacitors sufficient to store the needed charge.

The signal connector 1101 may be configured as one or more of various types of connectors depending on an interface scheme between the host device 1100 and the data storage device 1200.

The power connector 1103 may be configured as one or more of various types of connectors depending on a power supply scheme of the host device 1100.

Figure 8:
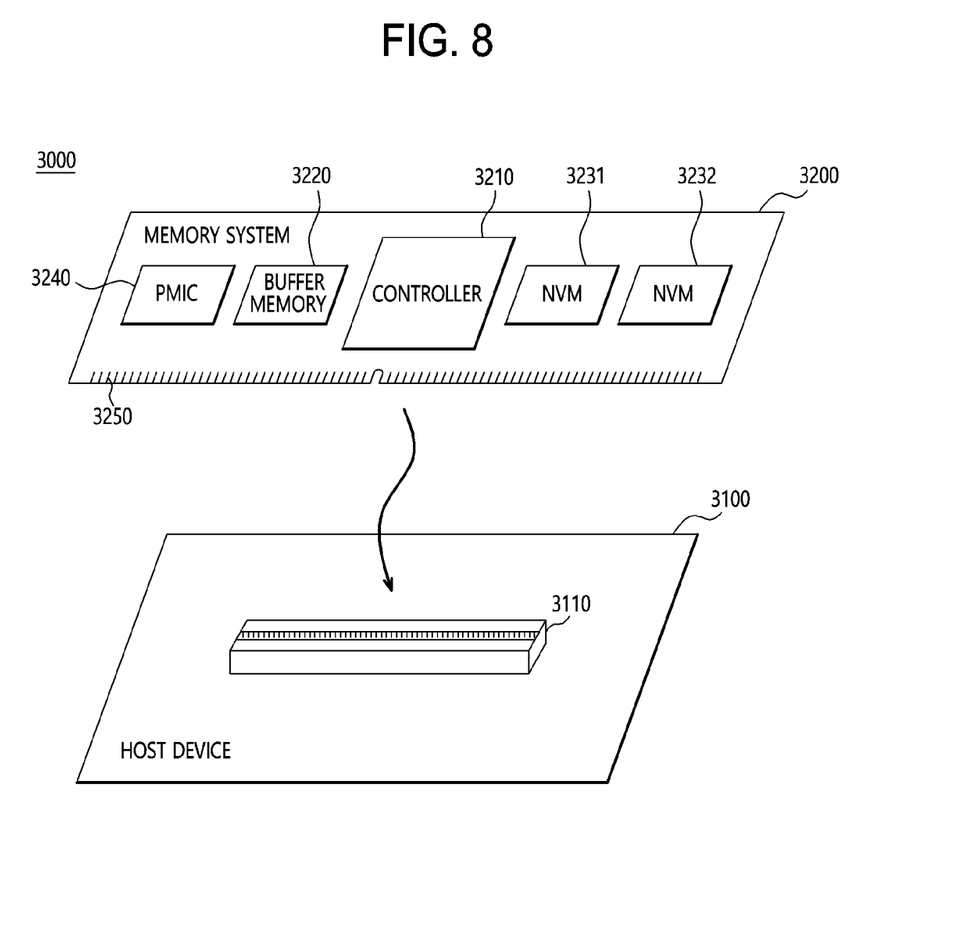
FIG. 8 and FIG. 9 are diagrams illustrating a data processing system in accordance with an embodiment of the disclosed technology.

FIG. 8 is a diagram illustrating a data processing system 3000, in accordance with an embodiment. Referring to FIG. 8, the data processing system 3000 may include a host device 3100 and a memory system 3200.

The host device 3100 may be configured in the form of a board, such as a printed circuit board. Although not shown, the host device 3100 may include internal function blocks for performing the function of a host device.

The host device 3100 may include a connection terminal 3110, such as a socket, a slot, or a connector. The memory system 3200 may be mated to the connection terminal 3110.

The memory system 3200 may be configured in the form of a board, such as a printed circuit board. The memory system 3200 may be referred to as a memory module or a memory card. The memory system 3200 may include a controller 3210, a buffer memory device 3220, nonvolatile memory devices 3231 and 3232, a power management integrated circuit (PMIC) 3240, and a connection terminal 3250.

The controller 3210 may control general operations of the memory system 3200. The controller 3210 may be configured in the same manner as the controller 110 shown in FIGS. 1 and 2.

The buffer memory device 3220 may temporarily store data to be stored in the nonvolatile memory devices 3231 and 3232. Further, the buffer memory device 3220 may temporarily store data read from the nonvolatile memory devices 3231 and 3232. The data temporarily stored in the buffer memory device 3220 may be transmitted to the host device 3100 or the nonvolatile memory devices 3231 and 3232 according to control of the controller 3210.

The nonvolatile memory devices 3231 and 3232 may be used as storage media of the memory system 3200.

The PMIC 3240 may provide the power inputted through the connection terminal 3250 to the inside of the memory system 3200. The PMIC 3240 may manage the power of the memory system 3200 according to control of the controller 3210.

The connection terminal 3250 may be coupled to the connection terminal 3110 of the host device 3100. Through the connection terminal 3250, signals such as commands, addresses, data, and so forth, and power may be transferred between the host device 3100 and the memory system 3200. The connection terminal 3250 may be configured as one or more of various types depending on an interface scheme between the host device 3100 and the memory system 3200. The connection terminal 3250 may be disposed on a side of the memory system 3200, as shown.

Figure 9:
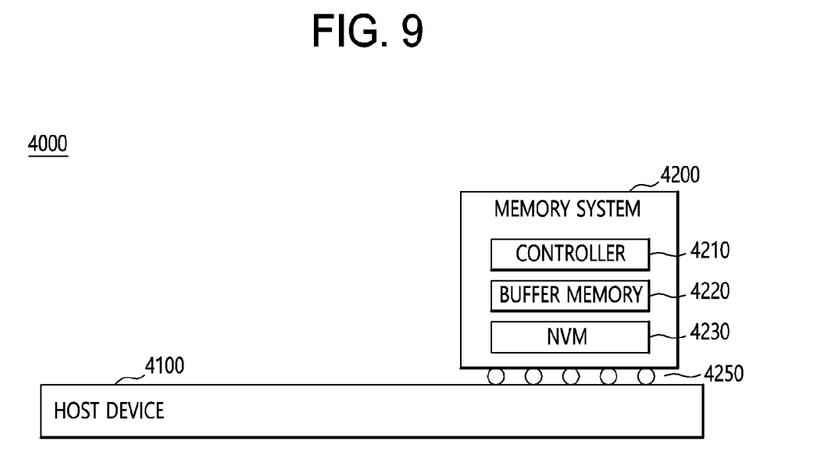

FIG. 9 is a diagram illustrating a data processing system 4000 in accordance with an embodiment. Referring to FIG. 9, the data processing system 4000 may include a host device 4100 and a memory system 4200.

The host device 4100 may be configured in the form of a board, such as a printed circuit board. Although not shown, the host device 4100 may include internal function blocks for performing the function of a host device.

The memory system 4200 may be configured in the form of a surface-mounted type package. The memory system 4200 may be mounted to the host device 4100 through solder balls 4250. The memory system 4200 may include a controller 4210, a buffer memory device 4220, and a nonvolatile memory device 4230.

The controller 4210 may control general operations of the memory system 4200. The controller 4210 may be configured in the same manner as the controller 110 shown in FIGS. 1 and 2.

The buffer memory device 4220 may temporarily store data to be stored in the nonvolatile memory device 4230. Further, the buffer memory device 4220 may temporarily store data read from the nonvolatile memory device 4230. The data temporarily stored in the buffer memory device 4220 may be transmitted to the host device 4100 or the nonvolatile memory device 4230 according to control of the controller 4210.

The nonvolatile memory device 4230 may be used as the storage medium of the memory system 4200.

Figure 10:
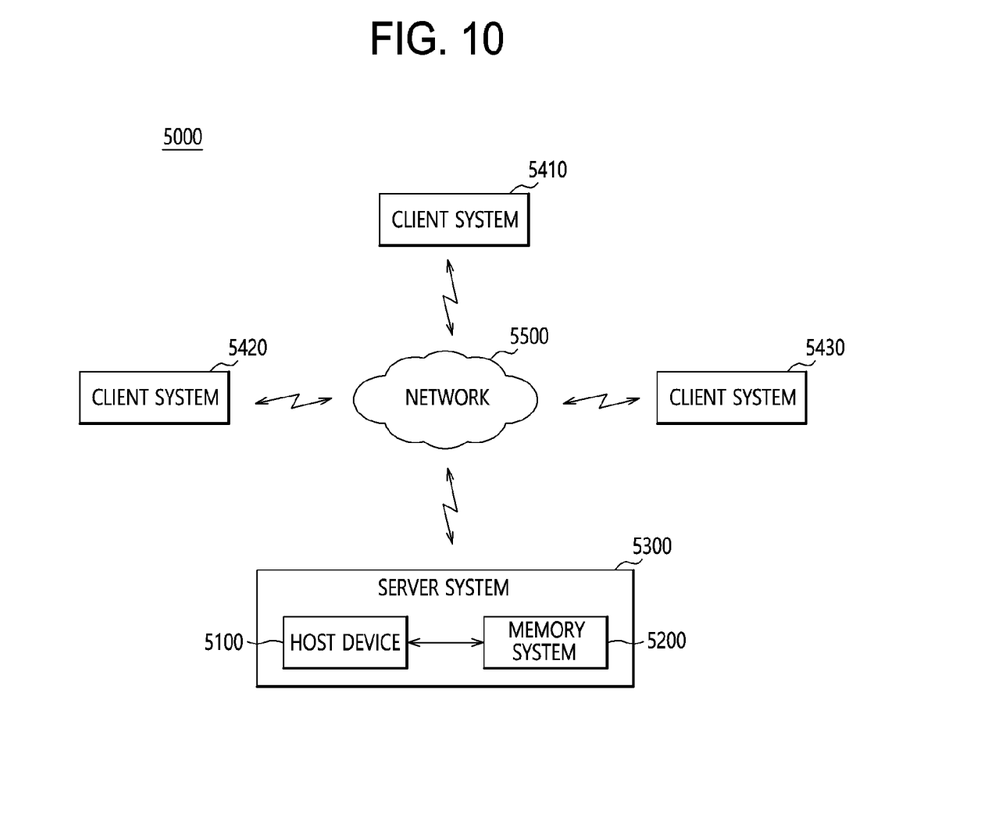
FIG. 10 is a diagram illustrating a network system including a data storage device in accordance with an embodiment of the disclosed technology.

FIG. 10 is a diagram illustrating a network system 5000 including a data storage device, in accordance with an embodiment. Referring to FIG. 10, the network system 5000 may include a server system 5300 and a plurality of client systems 5410, 5420, and 5430, which are coupled through a network 5500.

The server system 5300 may service data in response to requests from the plurality of client systems 5410 to 5430. For example, the server system 5300 may store the data provided by the plurality of client systems 5410 to 5430. For another example, the server system 5300 may provide data to the plurality of client systems 5410 to 5430.

The server system 5300 may include a host device 5100 and a memory system 5200. The memory system 5200 may be configured as the memory system 10 shown in FIG. 1, the data storage device 1200 shown in FIG. 7, the memory system 3200 shown in FIG. 8, or the memory system 4200 shown in FIG. 9.

Figure 11:
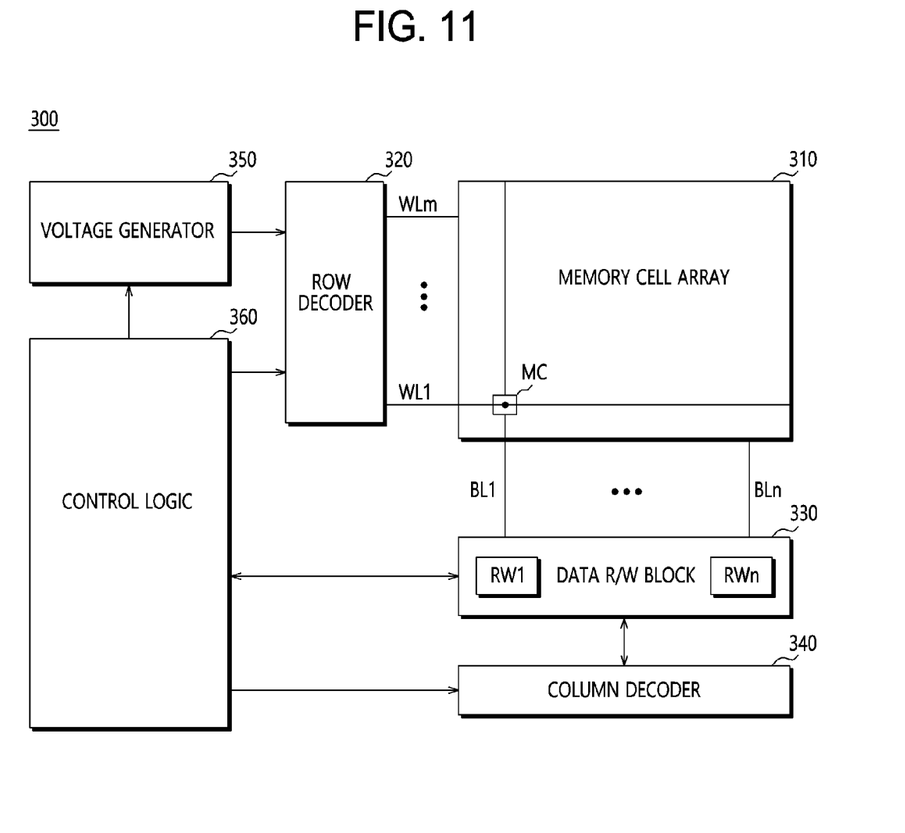
FIG. 11 is a block diagram illustrating a nonvolatile memory device included in a data storage device in accordance with an embodiment of the disclosed technology.

FIG. 11 is a block diagram illustrating a nonvolatile memory device 300 included in a data storage device, such as the data storage device 10, in accordance with an embodiment. Referring to FIG. 11, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The memory cell array 310 may comprise a three-dimensional memory array. The three-dimensional memory array, for example, has a stacked structure by perpendicular direction to the flat surface of a semiconductor substrate. Moreover, the three-dimensional memory array means a structure including NAND strings which memory cells comprised in NAND strings are stacked perpendicular to the flat surface of a semiconductor substrate.

The structure of the three-dimensional memory array is not limited to the embodiment indicated above. The memory array structure can be formed in a highly integrated manner with horizontal directionality as well as vertical directionality. In an embodiment, in the NAND strings of the three-dimensional memory array memory cells are arranged in the horizontal and vertical directions with respect to the surface of the semiconductor substrate. The memory cells may be variously spaced to provide different degrees of integration The row decoder 320 may be coupled with the memory cell array 310 through the word lines WL1 to WLm. The row decoder 320 may operate according to control of the control logic 360. The row decoder 320 may decode an address provided by an external device (not shown). The row decoder 320 may select and drive the word lines WL1 to WLm, based on a decoding result. For instance, the row decoder 320 may provide a word line voltage, provided by the voltage generator 350, to the word lines WL1 to WLm.

The data read/write block 330 may be coupled with the memory cell array 310 through the bit lines BL1 to BLn. The data read/write block 330 may include read/write circuits RW1 to RWn, respectively, corresponding to the bit lines BL1 to BLn. The data read/write block 330 may operate according to control of the control logic 360. The data read/write block 330 may operate as a write driver or a sense amplifier, according to an operation mode. For example, the data read/write block 330 may operate as a write driver, which stores data provided by the external device in the memory cell array 310 in a write operation. For another example, the data read/write block 330 may operate as a sense amplifier, which reads out data from the memory cell array 310 in a read operation.

The column decoder 340 may operate according to control of the control logic 360. The column decoder 340 may decode an address provided by the external device. The column decoder 340 may couple the read/write circuits RW1 to RWn of the data read/write block 330, respectively corresponding to the bit lines BL1 to BLn, with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided by the external device. For example, the control logic 360 may control operations of the nonvolatile memory device 300 such as read, write, and erase operations of the nonvolatile memory device 300.

Although various embodiments of the disclosed technology have been illustrated and described, variations of the disclosed embodiments and other embodiments may be made based on what is disclosed and/or illustrated.

What is claimed is:

1. A data storage apparatus for storing data under control by a memory controller of a separate host device, comprising:
   a memory device including memory cells for storing data; and an interface circuit coupled as an interface between the host device and the memory device and configured to transmit a transmission signal to the host,
   wherein the interface circuit includes a delay circuit configured to generate a delay code; and
   a pre-emphasis circuit configured to generate an additional signal by delaying the transmission signal by a delay time determined based on the delay code, and to combine the transmission signal and the additional signal.

2. The data storage apparatus according to claim 1, wherein the delay time corresponds to a one unit interval (UI) of the transmission signal.

3. The data storage apparatus according to claim 1, wherein the interface circuit includes a plurality of input/output circuits each including the pre-emphasis circuit, and the delay circuit is integrated together with the plurality of input/output circuits.

4. The data storage apparatus according to claim 1, wherein the delay circuit is configured to generate the delay code based on a clock signal used in duty cycle correction after power-up.

5. The data storage apparatus according to claim 1, wherein the interface circuit includes a plurality of input/output circuits, and
   the delay code is provided to each of the plurality of input/output circuits.

6. The data storage apparatus according to claim 1, wherein the pre-emphasis circuit includes a bypass circuit configured to receive a transmission data and outputs a corresponding signal without any delay and another delay circuit configured to receive an output signal from the delay circuit and outputs the additional signal.

7. A data storage apparatus comprising:
   an interface circuit including an input/output control circuit; and
   a memory device configured to transmit and receive data to and from a host through the interface circuit,
   wherein the input/output control circuit comprises:
   a delay circuit configured to generate an internal clock signal and a delay code based on a clock signal transmitted from the host; and
   a plurality of input/output circuits each configured to receive the delay code and generate an additional signal to be combined with a transmission signal to be transmitted to the host.

8. The data storage apparatus according to claim 7, wherein each of the plurality of input/output circuits comprises:
   a pre-emphasis circuit configured to generate the additional signal by delaying the transmission signal by a delay time determined based on the delay code.

9. The data storage apparatus according to claim 8, wherein the pre-emphasis circuit includes a bypass circuit configured to receive a transmission data and outputs a corresponding signal without any delay and another delay circuit configured to receive an output signal from the delay circuit and outputs the additional signal.

10. The data storage apparatus according to claim 8, wherein the delay time corresponds to an one unit interval (UI) of the transmission signal.

11. The data storage apparatus according to claim 7, wherein the delay circuit is integrated together with the plurality of input/output circuits.

12. The data storage apparatus according to claim 7, wherein the delay circuit is configured to generate the delay code on the basis of a clock signal used in duty cycle correction after power-up.

13. An interface circuit provided in a storage device including a memory device, the interface circuit comprising:
   a delay circuit configured to generate an internal clock signal and a delay code based on a clock signal transmitted from a host; and
   a plurality of input/output circuits, each configured to receive the delay code and generate an additional signal to be combined with a transmission signal to be transmitted to the host.

14. The interface circuit according to claim 13, wherein each of the plurality of input/output circuits comprises:
   a pre-emphasis circuit configured to generate the additional signal by delaying the transmission signal by a delay time determined based on the delay code.

15. The interface circuit according to claim 13, wherein the pre-emphasis circuit includes a bypass circuit configured to receive a transmission data and outputs a corresponding signal without any delay and another delay circuit configured to receive an output signal from the delay circuit and outputs the additional signal.

16. The interface circuit according to claim 14, wherein the delay time corresponds to an one unit interval (UI) of the transmission signal.

17. The interface circuit according to claim 14, wherein the delay circuit is integrated together with the plurality of input/output circuits.

18. The interface circuit according to claim 14, wherein the delay circuit is configured to generate the delay code based on a clock signal used in duty cycle correction after a power-up operation.

* * * * *